United States Patent
Wang et al.

(10) Patent No.: US 9,275,865 B2
(45) Date of Patent: Mar. 1, 2016

(54) PLASMA TREATMENT OF FILM FOR IMPURITY REMOVAL

(71) Applicant: Applied Materials, Inc., Santa Clara, CA (US)

(72) Inventors: Benjamin C. Wang, Santa Clara, CA (US); Joshua Collins, Sunnyvale, CA (US); Michael Jackson, Sunnyale, CA (US); Avgerinos V. Gelatos, Redwood City, CA (US); Amit Khandelwal, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 69 days.

(21) Appl. No.: 14/068,301

(22) Filed: Oct. 31, 2013

(65) Prior Publication Data

US 2014/0120700 A1    May 1, 2014

Related U.S. Application Data

(60) Provisional application No. 61/720,901, filed on Oct. 31, 2012.

(51) Int. Cl.
| | |
|---|---|
| *H01L 21/322* | (2006.01) |
| *H01L 21/285* | (2006.01) |
| *H01L 21/768* | (2006.01) |
| *C23C 16/02* | (2006.01) |
| *C23C 16/14* | (2006.01) |

(52) U.S. Cl.
CPC ...... *H01L 21/28556* (2013.01); *C23C 16/0227* (2013.01); *C23C 16/14* (2013.01); *H01L 21/76843* (2013.01); *H01L 21/76862* (2013.01); *H01L 21/76876* (2013.01); *H01L 21/76877* (2013.01)

(58) Field of Classification Search
CPC ............ H01L 21/76853; H01L 21/28556; H01L 21/76843; H01L 21/76862; H01L 21/76876; H01L 21/28562; H01L 21/28568; H01L 21/76844; C23C 16/14; C23C 16/0227; C23C 16/34; C23C 16/4554; C23C 16/45553; C23C 16/56

See application file for complete search history.

(56) References Cited

U.S. PATENT DOCUMENTS

| | | | |
|---|---|---|---|
| 6,465,348 B1 | 10/2002 | Wang | |
| 6,872,429 B1 | 3/2005 | Chen et al. | |
| 7,550,851 B2 | 6/2009 | Nguyen et al. | |
| 2002/0106846 A1 | 8/2002 | Seutter et al. | |
| 2003/0224620 A1* | 12/2003 | Kools et al. | 438/776 |
| 2005/0009325 A1* | 1/2005 | Chung et al. | 438/637 |

* cited by examiner

*Primary Examiner* — Charles Garber
*Assistant Examiner* — Abdulfattah Mustapha
(74) *Attorney, Agent, or Firm* — Patterson & Sheridan, LLP

(57) ABSTRACT

Methods for plasma treatment of films to remove impurities are disclosed herein. Methods for removing impurities can include positioning a substrate with a barrier layer in a processing chamber, the barrier layer comprising a barrier metal and one or more impurities, maintaining the substrate at a bias, creating a plasma comprising a treatment gas, the treatment gas comprising an inert gas, delivering the treatment gas to the substrate to reduce the ratio of one or more impurities in the barrier layer, and reacting a deposition gas comprising a metal halide and hydrogen-containing gas to deposit a bulk metal layer on the barrier layer. The methods can further include the use of diborane to create selective nucleation in features over surface regions of the substrate.

18 Claims, 5 Drawing Sheets

| Composition | As Deposited | With Ar-plasma Treatment |
|---|---|---|
| Density | 14.3 | 17.4 |
| Resistivity | 1128 uΩ-cm @ 35Å | 480 uΩ-cm @ 35Å |
| iPL-WN W | 40% | 70% |
| N | 27% | 9% |
| O | 7% | <4% |
| C | 27% | 21% |

PLASMA TREATMENT OF FILM FOR IMPURITY REMOVAL

CROSS-REFERENCE TO RELATED APPLICATIONS

This application claims benefit of U.S. Provisional Patent Application Ser. No. 61/720,901, filed Oct. 31, 2012, which is herein incorporated by reference.

BACKGROUND OF THE INVENTION

1. Field of the Invention

Embodiments of the invention relate generally to methods for processing a substrate during semiconductor manufacturing. Specifically, embodiments of the invention relate to methods of treating a nucleation layer prior to a CVD deposition process.

2. Description of the Related Art

Reliably producing nanometer-sized features is one of the key technologies for the next generation of semiconductor devices. The shrinking dimensions of circuits and devices have placed additional demands on processing capabilities. The multilevel interconnects that lie at the heart of integrated circuit technology require precise processing of high aspect ratio features, such as vias and other interconnects. Reliable formation of these interconnects is very important to future success and to the continued effort to increase circuit density and quality of individual substrates.

Metallization of features formed on substrates includes CVD deposition of metals such as tungsten. Tungsten can be used for metal fill of source contacts, drain contacts, metal gate fill and gate contacts as well as applications in DRAM and flash memory. Growth of CVD tungsten from $WF_6$ and $H_2$ gas mixtures typically requires a pre-deposited underlayer of metallic tungsten to crack $H_2$ into adsorbed atomic hydrogen and to initiate metal film growth.

In previous techniques, a tungsten nucleation layer is deposited from $WF_6$ and $SiH_4$ or $WF_6$ and $B_2H_6$ on a barrier and adhesion layer of TiN or WN by an ALD process. However, this technique is rapidly losing extendability into less than 20 nm features due to the increasing volume fraction of the feature being consumed by the barrier metal and ALD-W nucleation.

Therefore, there is much effort in the art to create a tungsten deposition process which reduces the use of intermediate layers prior to bulk tungsten fill.

SUMMARY OF THE INVENTION

Embodiments of the present invention generally provide methods of CVD deposition of metals in small features while reducing resistance of underlying layers. Specifically, the present invention generally provides methods to both control deposition of metals into trenches and vias while reducing the undesired effects of nucleation layers. In one embodiment, a method for removing impurities can include positioning a substrate with a barrier layer in a processing chamber, the barrier layer comprising a barrier metal and one or more impurities, maintaining the substrate at a bias, creating a plasma comprising a treatment gas, the treatment gas comprising an inert gas, delivering the treatment gas to the barrier layer to reduce the ratio of one or more impurities in the barrier layer, and reacting a deposition gas comprising a metal halide and hydrogen-containing gas to deposit a bulk metal layer on the barrier layer.

In another embodiments, a method for removing impurities can include positioning a substrate in a processing chamber, creating a first plasma comprising a first treatment gas, the first treatment gas comprising an inert gas, delivering the first treatment gas to the barrier layer to reduce the ratio of one or more impurities in the barrier layer, exposing the barrier layer to diborane ($B_2H_6$) gas to deposit a layer of adsorbed boron in the barrier layer, creating a second plasma comprising a second treatment gas, the second treatment gas comprising an inert gas, delivering the second treatment gas to the barrier layer while maintaining the substrate with a bias at a voltage less than the sputter threshold of the barrier metal to remove boron from the upper surface, exposing the barrier layer to a gas mixture comprising $WF_6$ to deposit a thin layer of tungsten in the features, and reacting a deposition gas comprising a tungsten halide and hydrogen-containing gas to deposit a bulk tungsten layer on the thin layer of tungsten and the barrier layer. In this embodiment, the substrate can include an upper surface having one or more features, and a barrier layer formed over the upper surface and the one or more feature, where the barrier layer comprises tungsten and nitrogen.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 4 is a table depicting the barrier layer film properties both with and without plasma treatment, according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally provide methods of CVD deposition of metals, such as tungsten, in small features while reducing resistance of or removing the need for underlying layers. Deposition of tungsten in features by standard techniques can lead to an increase in both the starting bulk and the overall resistance of the deposition product. Tungsten nucleation layers and in particular ALD nucleation layers from $B_2H_6$ and tungsten hexafluoride ($WF_6$) have been successful in terms of conformality and in promoting good tungsten fill for features less than 32 nm, but are generally highly resistive compared to tungsten from $WF_6$ and $H_2$. Experimentally determined resistance for ALD tungsten deposited from $B_2H_6$ and $WF_6$ is approximately 150 $\mu\Omega$-cm in comparison to CVD tungsten deposition from $WF_6$ and $H_2$ which is less than 20 $\mu\Omega$-cm. Both the ALD tungsten and the CVD tungsten are subsequently deposited on a tungsten nitride (WN) layer to increase adhesion to underlying surfaces. By removing impurities such as oxygen, nitrogen and to a lesser extent carbon from an upper most layer of the WN, an exposed tungsten layer is created. The exposed tungsten layer can be used as a nucleation layer, thus providing a new means for conformal deposition of tungsten.

Though exemplary embodiments and explanations focus on tungsten or titanium, it is understood that metals other than tungsten can used with the deposition techniques described herein without diverging from the invention as disclosed. The invention as disclosed herein is clarified with reference to the figures discussed below.

Figure 1:
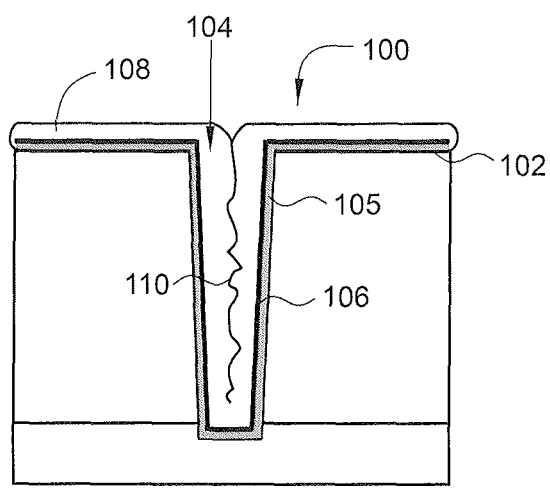
FIG. 1 is a cross-sectional view of a substrate with a feature according to standard tungsten deposition techniques.

FIG. 1 is a cross-sectional view of a substrate 100 with a feature according to standard tungsten deposition techniques. As depicted herein, the substrate 100 has an upper surface 102 and a feature 104. The substrate 100 can be of a standard composition, such as crystalline silicon substrate. The feature 104 can be an etched feature, such as a via or a trench. The feature formed therein can have varying cross-sectional dimensions. For example, the substrate can have a feature with a width that varies from 4-8 nm, an overall depth of 110 nm and an aspect ratio of 25:1.

A barrier layer 105 can be deposited on the upper surface 102 and the feature 104 creating a conformal layer over the surfaces. The barrier layer 105 comprises a metal nitride, such as WN or titanium nitride (TiN). It is believed that the barrier layer 105 assists with conformal binding of later deposited metals to the surface of the substrate 100, such as bulk deposition of tungsten by a CVD process.

A thin metal layer 106 may be deposited by chemical reaction over the barrier layer 105, such as a thin conformal layer of tungsten deposited by atomic layer deposition (ALD). A fill layer 108 is deposited conformally over the thin metal layer 106. The fill layer is generally deposited by a CVD process, such as the deposition of tungsten from $WF_6$ and $H_2$. Once metal growth is established, it accelerates from the point of nucleation to create a fill layer 108 in the feature 104 and on the upper surface 104. The thin metal layer 106 is deposited to overcome low deposition on the barrier layer 105.

Without intending to be bound by theory, the nitrogen in the barrier layer 105 is believed to both increase binding of the deposited metal to the substrate and reduce catalytic activity of the metal, such as the catalytic activity of tungsten for splitting gaseous hydrogen ($H_2$) into atomic hydrogen (H). The thin metal layer 106 is deposited to increase the catalytic activity on the barrier layer 105. As the resistance for the thin metal layer is believed to be approximately 150 μΩ-cm and the resistance of the fill layer 108 is believed to be less than 20 μΩ-cm, it is desirable to reduce or eliminate the thin metal layer 106 at least inside the feature 104.

As the layer grows from all surfaces simultaneously and at the same rate, two problems can occur. First, as areas of the feature 104 are growing together simultaneously, a seam 118 can form when the growth from the fill layer 108 meets. This seam 118 creates space for post-processing reactants to damage the uniformity of the tungsten fill layer 108, such as those used in conjunction with a CMP, as well as creating voids. Second, the thin metal layer 106 is expected to affect the resistivity of the overall fill in a feature 104 with smaller cross-sectional dimensions. As the thin metal layer 106 occupies more space in smaller features, such as the feature 104 with cross sectional dimensions of less than 20 nm, the fill layer 108 does not occupy as much of the feature 104.

The method described herein helps avoid both seam formation and increased resistivity. By treating a portion of the barrier layer 105 to remove the impurities, such as oxygen, nitrogen and carbon, a portion of the WN surface can be converted to a substantially tungsten surface. The bulk of the barrier layer 105 remains WN (surface binding is not affected) while an upper portion of the barrier layer 105 is converted to tungsten. The presence of tungsten in the barrier layer 105 allows the barrier layer 105 to catalyze the formation of the fill layer 108 without a thin metal layer 106.

Figure 2:
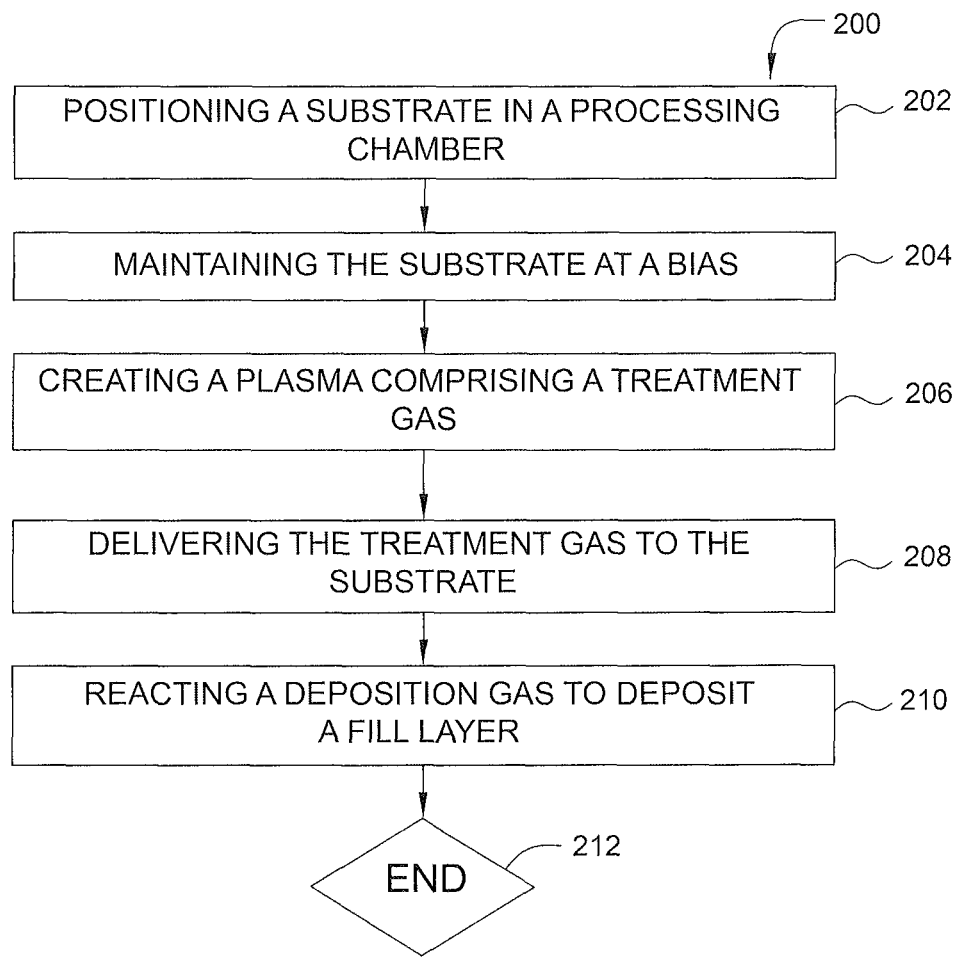
FIG. 2 is a block diagram of a method for depositing a fill layer according to one embodiment.

FIG. 2 is a block diagram of a method 200 for depositing a fill layer according to one embodiment. The method 200 can include positioning a substrate in a processing chamber, as in 202. The substrate can be of any composition, such as a crystalline silicon substrate. The substrate can have a WN or a TiN layer deposited over the surface. The layer can be a primarily WN or TiN layer with various impurities therein, such as a WN layer with between 35%-60% tungsten, 20%-30% nitrogen and the remaining comprising oxygen and carbon. The substrate can also include one or more features, such as a via or an interconnect. The processing chamber used with one or more embodiments can be any CVD processing chamber, such as an Isani XT pre-clean chamber available from Applied Materials, Inc located in Santa Clara, Calif. Flow rates and other processing parameters described below are for a 200 mm substrate. It should be understood these parameters can be adjusted based on the size of the substrate processed and the type of chamber used without diverging form the invention disclosed herein.

The method 200 can further include maintaining the substrate at a bias, as in 204. The substrate can be maintained at a bias, such as a bias of between 2 MHz to 60 MHz, with preferred embodiments of 13.56 MHz. The bias delivered to the substrate should be less than the energy required for sputtering the WN or TiN layer. In some embodiments, the bias is significantly lower than that required for sputtering. In one embodiment, the bias is delivered to the substrate at a power of between 50 W and 100 W, such as 75 W. The use of a bias in this embodiment is optional and is not necessary for the removal of impurities from the surface of the barrier layer.

The method 200 can include creating a plasma comprising a treatment gas, as in 206. A plasma comprising the treatment gas can be formed by any known mechanism, such as an inductively formed plasma or a remote plasma. In one embodiment, the plasma is formed using an RF power source at a frequency of from 400 KHz to 60 MHz. In exemplary embodiments, the plasma can be formed at a power level of 450 W to 550 W, such as 500 W. The treatment gas can be formed from an inert gas, such as helium (He), neon (Ne), argon (Ar), or krypton (Kr). The treatment gas can also comprise a secondary gas, such as gaseous hydrogen ($H_2$). The $H_2$ can be incorporated into any inert gas mixture. The $H_2$ can be incorporated at a range of 1%-20%.

The method 200 can include delivering the treatment gas to the substrate, as in 208. The treatment gas can be delivered either as a plasma or as an activated gas, such as a gas delivered from a remote plasma source. The nitrogen is believed to be loosely bound to the metal. As the treatment gas is delivered to the substrate, the nitrogen from exposed portions of the barrier layer is displaced by the inert gas. The inert gas also does not react with the tungsten and thus impurities are removed from the layer.

Without intending to be bound by theory, it is believed that the energy delivered to the plasma and the bias to the substrate should be maintained so as to prevent sputtering of the barrier layer. If plasma is produced at an energy level which can sputter the layer, the plasma treatment can result in barrier damage and poor sidewall treatment inside high aspect ratio (AR) features. At or below the sputter threshold, ion directionality of the plasma is less and plasma treatment time can be extended for treatment of sidewall features without damage to the field or corners. Though lighter gases are not as likely to sputter the barrier layer, there is a possibility of implantation which should also be avoided.

The substrate temperature may be increased in some embodiments to achieve a similar result using a lower bias. For example, the substrate can be maintained at a temperature between 250° C. and 450° C. during the delivery of plasma. The temperature range restriction relates to the reduced thermal budget for semiconductors after transistor gate fabrication. As such, for substrates which, due to composition or lack of such structures, have a different thermal budget, the temperature range may be increased or decreased with relation to the thermal budget required by features on the substrate.

The method 200 can include reacting a deposition gas to deposit a fill layer, as in 210. After the tungsten or titanium surface has been formed from the WN or TiN surface respectively, a fill layer is deposited by a CVD process. The CVD process can be any available CVD process, such as a thermal CVD process. The reactant gases for the CVD can include a metal halide, such as a tungsten halide or a titanium halide, and a hydrogen-containing gas, such as $H_2$. Examples of metal halides can include $TiF_4$, $TiCl_4$, $WF_6$ or $WCl_6$.

Not wishing to be bound by theory, it is believed that the metal halides are adsorbed on the exposed surface and reacted with H to form a metal deposition. For example, the tungsten hexafluoride ($WF_6$) or tungsten hexachloride ($WCl_6$) is believed to be adsorbed on the exposed surface of the substrate which reacts to form $WF_5$ and F. The $H_2$ is believed to be catalyzed by the exposed and unbound tungsten to form H atoms from $H_2$. The H atoms can then react with the adsorbed F to create HF which desorbs from the surface leaving behind metallic tungsten and further adsorption sites. The reaction mechanism of $WF_6$ can be summarized as follows:

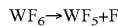

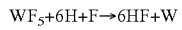

$WCl_6$, $TiF_4$, and $TiCl_4$ are believed to have a similar reaction mechanism. The reaction mechanism above requires an available catalyst for the formation of hydrogen atoms from $H_2$. In the absence of a catalyst, the available binding sites for $WF_6$ is rate limiting. Since WN and TiN are not a good catalysts for the formation of H atoms from $H_2$, the conversion of the metal nitride to the metal speeds up catalytic activity in the barrier layer.

The $WF_6$ is adsorbed on all available surfaces but since the formation of atomic hydrogen from $H_2$ is catalyzed significantly better at tungsten surfaces than WN surfaces, nucleation is slower at WN surfaces than at tungsten surfaces. Temperature also affects the formation of atomic hydrogen from $H_2$. As such, the growth temperature for the fill layer can be between 250° C. and 450° C., with preferred embodiments between 300° C. and 350° C. The fill layer deposited by this embodiment is expected to be deposited conformally over the substrate as impurities are expected to be removed from the barrier layer without differentiating between directionality of the barrier layer. Stated differently, the fill layer is expected to deposit on the sidewalls of a feature and the bottom of a feature with a treated barrier layer at a rate expected from a substrate with a nucleation layer formed over the barrier layer.

Once the fill layer is deposited on the barrier layer to a desired thickness, the method 200 can be halted, as in 212. In preferred embodiments, the thickness of the upper surface portion of the fill layer once deposition is complete is between 1500 Å to 3500 Å. The substrate can then be removed from the chamber for further processing.

Figure 3:
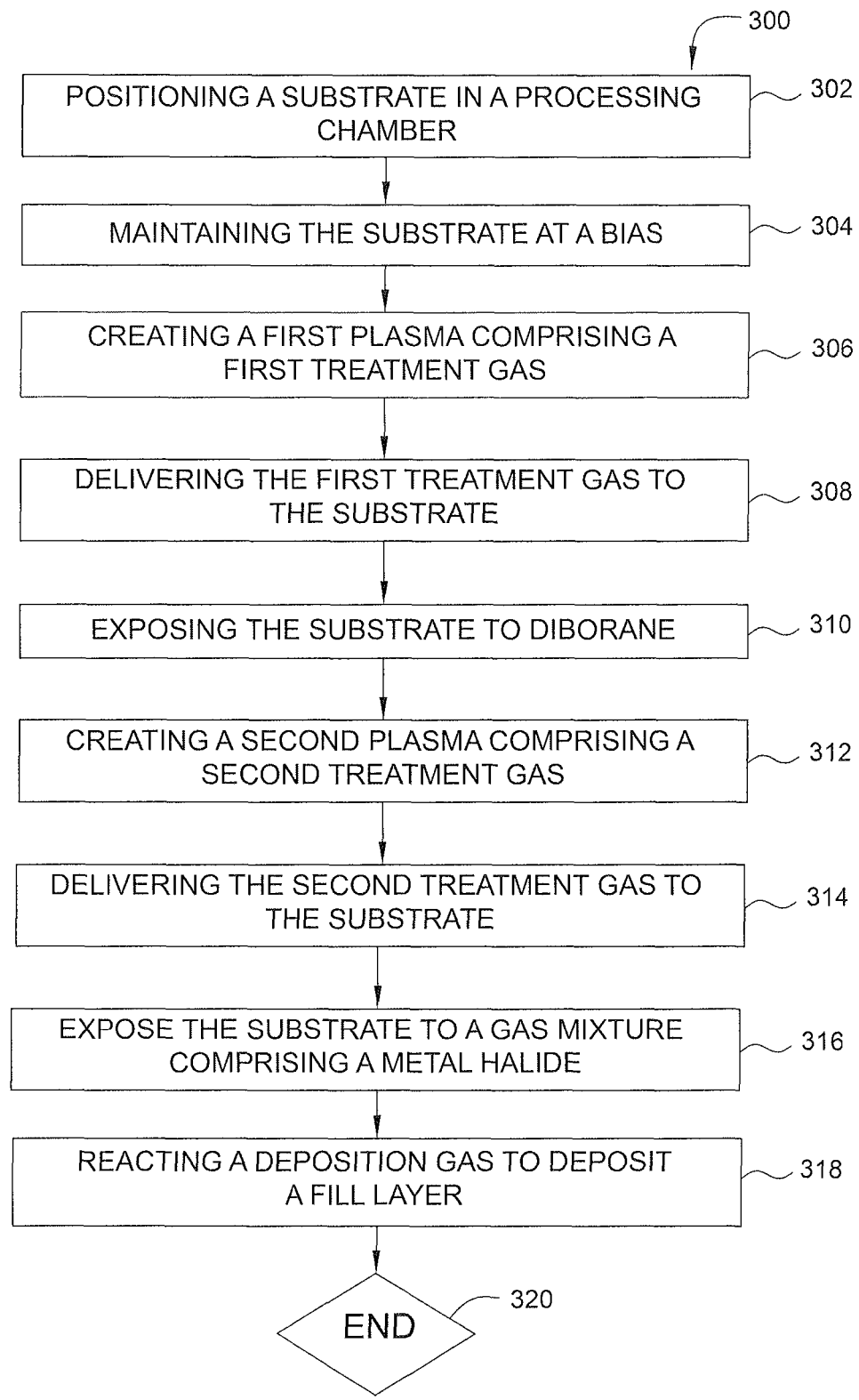
FIG. 3 is a block diagram of a method for depositing a fill layer according to one embodiment.

FIG. 3 is a block diagram of a method 300 for depositing a fill layer according to one embodiment. The method 300 can include positioning a substrate in a processing chamber, as in 302. The substrate and the processing chamber used in this embodiment may be the same as the ones described with reference to FIG. 2.

The method 300 can further include maintaining the substrate at a bias, as in 304. The bias delivered to the substrate should be less than the energy required for sputtering the WN or TiN layer. In some embodiments, the bias is significantly lower than that required for sputtering. The substrate can be maintained at a bias using the parameters described with reference to FIG. 2. As stated previously, biasing the substrate is optional.

The method 300 can include creating a first plasma comprising a treatment gas, as in 306. A plasma comprising the treatment gas can be formed by any known mechanism, such as an inductively formed plasma or a remote plasma. The treatment gas can be formed from an inert gas, such as helium (He), neon (Ne), argon (Ar), or krypton (Kr). The treatment gas can also comprise a secondary gas, such as $H_2$. The $H_2$ can be incorporated into any inert gas mixture.

Without intending to be bound by theory, hydrogen is expected to be most beneficial to removal of impurities in combination with an inert gas. Remote or direct hydrogen containing plasma are more effective at reducing nitrogen and carbon content in WN films. However, atomic hydrogen, as formed in a plasma, has a short lifetime after surface collisions. As inert gases, by definition, are non-reactive, surface collisions are not expected to reduce the effectiveness of the inert gases. Thus, the combination of hydrogen and an inert gases can provide an enhanced impurity removal for the barrier layer in both field and feature regions on a substrate.

The method 300 can further include delivering the first treatment gas to the substrate, as in 308. The treatment gas can be delivered either as a plasma or as an activated gas, such as a gas delivered from a remote plasma source. The nitrogen is believed to be loosely bound to the metal. As the treatment gas is delivered to the substrate, the nitrogen from exposed portions of the barrier layer is displaced by the inert gas. The inert gas also does not react with the tungsten and thus impurities are removed from the layer.

The method 300 can further include exposing the substrate to $B_2H_6$, as in 310. After the barrier layer has been treated with the first treatment gas, the barrier layer can be exposed to $B_2H_6$ to adsorb a layer onto the surface. The $B_2H_6$ soak can be delivered at a pressure of from 1 Torr to 30 Torr. The exposure time for the $B_2H_6$ soak can be from about 5 seconds to about 15 seconds. The $B_2H_6$ can be delivered with an inert gas, such as He, Ne, Ar, Kr or combinations thereof. The inert gas can be used to maintain a specific pressure while decreasing the concentration of the $B_2H_6$ in the gas mixture. The concentration of $B_2H_6$ in the gas mixture, when an inert gas is used, can be from 3 atomic % to 20 atomic %, with preferred embodiments employing a concentration between 3 atomic percent and 7 atomic percent. In one embodiment, the $B_2H_6$ can be delivered to the substrate at a pressure of 15 Torr over 10 seconds at a flow rate of 400 sccm and a $B_2H_6$ concentration of 5 atomic %.

Without intending to be bound by theory, the $B_2H_6$ is believed to be preferentially applied after the plasma treatment to ensure nucleation of the fill layer without formation of high resistivity compounds. Under the described conditions, $B_2H_6$ is very reactive. If the substrate is treated with $B_2H_6$ before the plasma treatment, a number of exposed active molecules will be present on the surface of the substrate, such as nitrogen and carbon. The reaction of the $B_2H_6$ with the exposed active molecules can create boron nitrides and boron carbides. Once reacted, the $B_2H_6$ will not be available for subsequent reaction. By removing these reactants with the plasma treatment prior to treatment with $B_2H_6$, a reactive species will be deposited which can further react with the $WF_6$.

The method 300 can further include creating a second plasma comprising a second treatment gas, as in 312. The second plasma can be of the same composition as the first plasma. The second plasma comprising the second treatment gas can be formed by any known mechanism, such as an inductively formed plasma or a remote plasma. The second treatment gas can be further tailored to preferentially target specific areas of the substrate. In one embodiment, the second treatment gas can be primarily a hydrogen gas. As previously discussed, a hydrogen gas would be expected to be active more at the surface than in the features. As it is desirable to remove adsorbed $B_2H_6$ from the surface and not from the features, the selectivity of hydrogen for the exposed surfaces over the features is expected to be beneficial.

The method 300 can further include delivering the second treatment gas to the substrate, as in 314. The second treatment gas can be in the form of a plasma or an activated gas. The second treatment gas is delivered to the substrate to remove $B_2H_6$ and other boron compounds from surface regions of the barrier layer without removing $B_2H_6$ from inside the features. As the $B_2H_6$ is only loosely bound to the surface, the inert gas can remove the adsorbed $B_2H_6$ without affecting the substrate. In preferred embodiments, the second plasma treatment is done in the presence of a bias. The bias voltage should be less than sputter threshold of tungsten but greater than threshold required to strip $B_2H_6$ or boron-containing substances from substrate.

The method 300 can further include exposing the substrate to a gas mixture comprising a metal halide, as in 316. In this embodiment, the substrate can then be exposed to a gas mixture comprising a tungsten halide, such as $WF_6$ or $WF_6$ and $B_2H_6$, to preferentially initiate nucleation of tungsten deposition, such as tungsten deposited by a CVD process using $WF_6$ and $H_2$. In this scheme tungsten growth is accelerated inside feature where plasma treatment is weakest, as the weakest plasma treatment correlates with increased presence of $B_2H_6$. The adsorbed $B_2H_6$ will allow tungsten to be deposited on the barrier layer from reaction with $WF_6$. After the post treatment with the gas mixture comprising a tungsten halide, bulk deposition of tungsten, such as by CVD using $WF_6$ and $H_2$ will preferentially form over the thin tungsten nucleation layer inside the feature.

Without intending to be bound by theory, it is believed that since the upper surface of the barrier layer is cleaned of impurities, the high resistance of the ALD nucleation layer can be avoided. As previously described, $B_2H_6$ is very reactive. Further, some of the byproducts of reaction with the non-plasma treated surface include boron nitrides and boron carbides. Boron nitrides and boron carbides have a high resistance compared to that of tungsten. Thus, it is believed that during a standard ALD process over a barrier layer, boron nitrides and boron carbides are formed as well as the tungsten which is formed by reaction with $B_2H_6$. By removing these impurities prior to a partial ALD from $WF_6$ and $B_2H_6$, it is believed that the resistivity increase can be at least partially avoided.

The method 300 can further include reacting a deposition gas to deposit a fill layer, as in 318. After the tungsten or titanium surface has been formed from the WN or TiN surface respectively, a fill layer is deposited by a CVD process. The CVD process can be any available CVD process, such as a thermal CVD process. The reactant gases for the CVD can include a metal halide, such as a tungsten halide or a titanium halide, and a hydrogen-containing gas, such as $H_2$. Examples of metal halides can include $TiF_4$, $TiCl_4$, $WF_6$ or $WCl_6$. The parameters for deposition of the fill layer can be the same as those described with reference to FIG. 2.

Once the fill layer is deposited on the second nucleation layer to a desired thickness, the method 300 can be halted, as in 320. In this embodiment, deposition on the upper surface of the barrier layer is expected to be slower than deposition on the feature portion of the barrier layer, due to the partially formed nucleation layer. In preferred embodiments, the thickness of the upper surface portion of the fill layer once deposition is complete is between 1500 Å to 3500 Å. The substrate can then be removed from the chamber for further processing.

FIG. 4 is a table depicting the barrier layer film properties both with and without plasma treatment, according to one embodiment. The table 400 shows density, resistivity and composition of an exemplary barrier layer prior to fill layer deposition. The barrier layer of this embodiment is a WN barrier layer. The density of the barrier layer as deposited was measured at approximately 14.3 g/cm$^3$. The resistivity of the layer at 35 Å thickness was determined to be 1128 μΩ-cm. The composition of the layer as deposited was 40 atomic % tungsten, 27 atomic % nitrogen, 7 atomic % oxygen, and 27 atomic % carbon.

The WN barrier was then treated with an argon plasma as described with reference to FIG. 2. Post plasma treatment, a number of improvements in layer quality were measured in the resulting barrier layer. The barrier layer density increased to 17.4 as well as the resistivity of the layer reduced to 480 μΩ-cm. The composition of the layer after treatment shifted in favor of tungsten composition which was determined to be approximately 70 atomic % tungsten, 9 atomic % nitrogen, less than 4 atomic % oxygen, and 21 atomic % carbon. The improvements seen in the barrier layer are believed to be related to the increased atomic % tungsten. Further, these benefits are not believed to extend beyond the upper most surface of the barrier layer, as both the plasma and bias energy are maintained below the sputtering threshold. Therefore, the barrier layer can act both to nucleate the fill layer deposition and to maintain binding of the fill layer to underlying layers.

Figure 5:
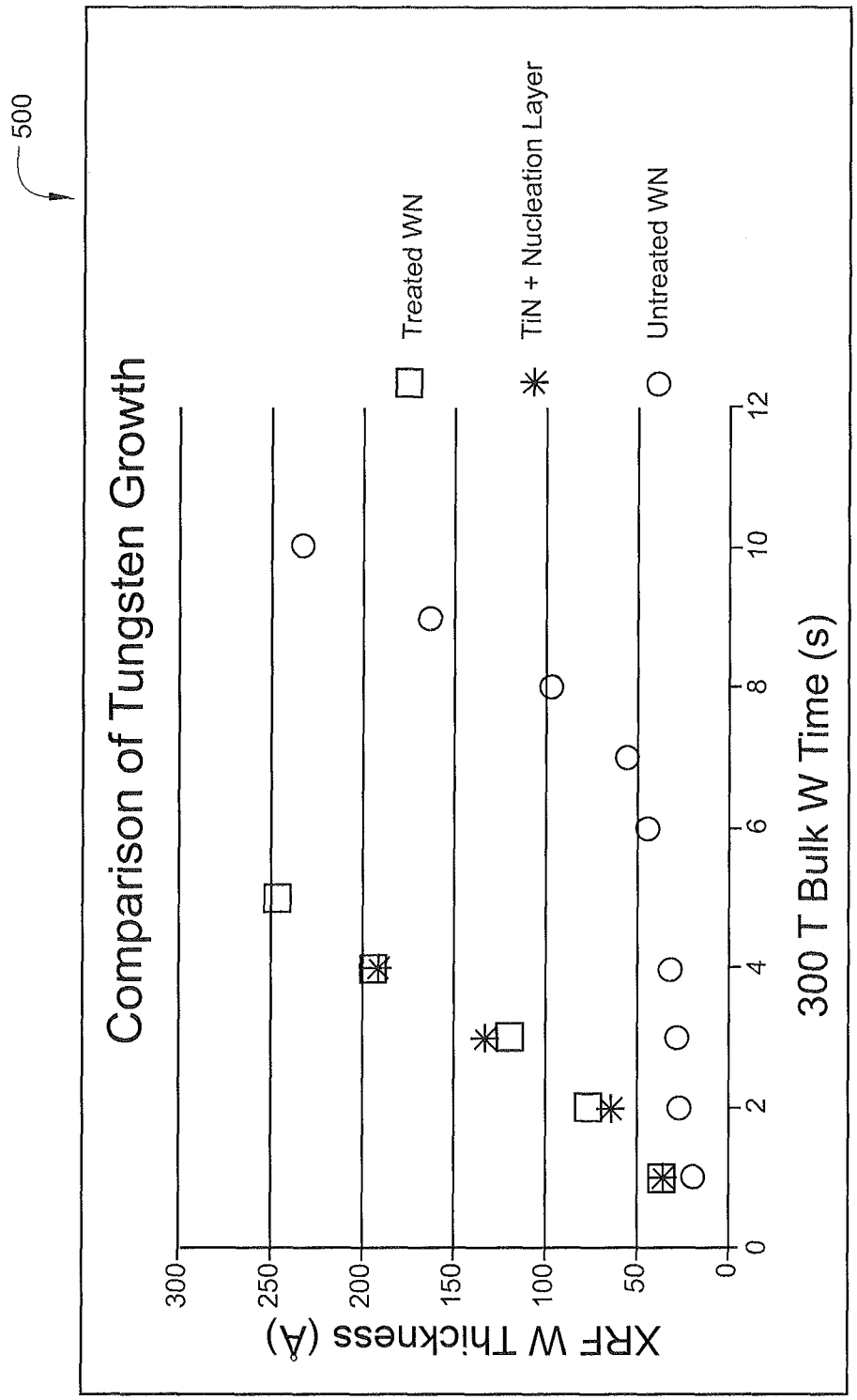
FIG. 5 is a graph of tungsten growth on a WN barrier layer in the presence and absence of plasma treatment.

FIG. 5 is a graph of tungsten growth on a WN barrier layer in the presence and absence of plasma treatment. The graph 500 shows tungsten deposition on both a treated and untreated WN barrier layer. The barrier layers were either pretreated with an argon plasma as described with reference to FIG. 2 or untreated. The bulk tungsten was then deposited by CVD using $WF_6$ and $H_2$ with a pressure of 300 Torr at 300° C. Measurements of tungsten growth were taken at 1, 2, 3, 4, 6, 7, 8, 9 and 10 seconds for the untreated barrier layer. Measurements of tungsten growth were taken at 1, 2, 3, 4, and 5 seconds for the treated barrier layer, due to the significantly more rapid nucleation rate.

The nucleation rate on the treated barrier layer is significantly higher than the untreated barrier layer. By the 1 second time point shown in the graph 500, tungsten growth had already begun on the treated barrier layer. The untreated barrier layer show an insignificant level of growth until about 7 seconds of treatment, indicating a delay in nucleation. Comparatively, the untreated barrier layer at 7 seconds and the treated barrier layer at 1 second have approximately the same growth rate, showing that the effect of the treatment doesn't extend beyond the nucleation of the fill layer. The 6 second shift in nucleation time is believed to be related to the increased tungsten at the surface of the barrier layer.

For further comparison, a substrate with a TiN barrier layer and a nucleation layer for CVD growth by traditional means is transposed onto the WN comparison. Though optimal conditions for growth of the titanium fill layer on the nucleation layer were used, the tungsten growth on the treated WN barrier layer has the same nucleation rate as the titanium growth using a traditional titanium nucleation layer.

CONCLUSION

Embodiments of the present invention generally provide methods of treating a barrier layer to allow nucleation of tungsten or other metals on treated surfaces and improve feature fill. As features decrease in size, such as below 20 nm, proper tungsten fill in those features becomes more difficult. Movement of tungsten into feature can be inhibited by the nucleation layer itself. As well, the nucleation layer is believed to have a higher resistivity than the fill layer. By removing impurities from the preexisting barrier layer, bulk CVD deposition of tungsten could be nucleated from the barrier layer itself, thus allowing bulk deposition in the absence of a nucleation layer. Further embodiments can include deposition with a partial nucleation layer, thus increasing nucleation on features portions of the barrier layer over the upper surfaces of the barrier layer.

While the foregoing is directed to embodiments of the invention, other and further embodiments of the invention may be devised without departing from the basic scope thereof, and the scope thereof is determined by the claims that follow.

What is claimed is:

1. A method for removing impurities, comprising:
    positioning a substrate with a barrier layer in a processing chamber, the barrier layer comprising titanium nitride or tungsten nitride;
    maintaining the substrate at a bias, wherein the bias is less than a sputtering bias for titanium nitride or tungsten nitride;
    creating a plasma comprising a treatment gas, the treatment gas comprising an inert gas, wherein the plasma has an energy level which is less than a sputtering energy for titanium nitride or tungsten nitride;
    delivering the treatment gas to an exposed portion of the barrier layer to create a titanium layer or tungsten layer respectively from the exposed portion, the titanium layer or the tungsten layer having a reduced ratio of nitrogen as compared to the titanium nitride or the tungsten nitride respectively; and
    reacting a deposition gas comprising a tungsten halide or a titanium halide and a hydrogen-containing gas to deposit a bulk metal layer directly on the barrier layer.

2. The method of claim 1, wherein the treatment gas comprises a gas selected from the group consisting of helium (He), neon (Ne), argon (Ar), krypton (Kr), gaseous hydrogen ($H_2$) or combinations thereof.

3. The method of claim 1, further comprising maintaining the substrate at a first temperature during plasma treatment.

4. The method of claim 3, wherein the first temperature is from 250° C. to 450° C.

5. The method of claim 1, wherein the bias is an RF bias from 2 MHz to 60 MHz.

6. The method of claim 1, wherein the bias is less than the sputter threshold of the barrier metal.

7. The method of claim 1, wherein the plasma is created from an RF source with a frequency from 400 KHz to 60 Mhz.

8. The method of claim 1, wherein the deposition gas comprises a tungsten halide, and wherein the tungsten halide is selected from the group consisting of tungsten hexafluoride ($WF_6$), tungsten hexachloride ($WCl_6$), and combinations thereof.

9. The method of claim 1, wherein the deposition gas comprises a titanium halide, and wherein the titanium halide is selected from the group consisting of titanium tetrafluoride ($TiF_4$), titanium tetrachloride ($TiCl_4$), and combinations thereof.

10. The method of claim 1, wherein the bulk metal layer is deposited at a temperature between 250° C. and 350° C.

11. The method of claim 1, wherein the one or more impurities comprise nitrogen, oxygen, carbon or combinations thereof.

12. A method for removing impurities, comprising:
    positioning a substrate in a processing chamber, the substrate comprising:
        an upper surface having one or more features; and
        a barrier layer formed over the upper surface and the one or more feature, where the barrier layer comprises tungsten and nitrogen;
    creating a first plasma comprising a first treatment gas, the first treatment gas comprising an inert gas;
    delivering the first treatment gas to the barrier layer to reduce the quantity of nitrogen in an exposed surface of the barrier layer;
    exposing the barrier layer to diborane ($B_2H_6$) gas to deposit a layer of adsorbed boron in the barrier layer;
    creating a second plasma comprising a second treatment gas, the second treatment gas comprising an inert gas;
    delivering the second treatment gas to the barrier layer while maintaining the substrate with a bias at a voltage less than the sputter threshold of the barrier metal to remove boron from the upper surface, wherein boron is maintained in the features;
    exposing the barrier layer to a gas mixture comprising $WF_6$ to deposit a thin layer of tungsten preferentially in the features; and
    reacting a deposition gas comprising a tungsten halide and hydrogen-containing gas to deposit a bulk tungsten layer on the thin layer of tungsten and the barrier layer.

13. The method of claim 12, wherein the bias voltage is greater than the threshold required to strip adsorbed $B_2H_6$ or boron.

14. The method of claim 12, wherein the treatment gas comprises a gas selected from the group consisting of He, Ne, Ar, Kr, $H_2$ or combinations thereof.

15. The method of claim 12, further comprising delivering a treatment bias while the substrate receives the first plasma.

16. The method of claim 15, wherein the bias is an RF bias from 2 MHz to 60 MHz.

17. The method of claim 12, wherein the plasma is created from an RF source with a frequency from 400 KHz to 60 Mhz.

18. The method of claim 12, wherein the bulk metal layer is deposited at a temperature between 250° C. and 350° C.

* * * * *